United States Patent
Sasaki et al.

(10) Patent No.: US 11,387,407 B2
(45) Date of Patent: Jul. 12, 2022

(54) SPIN-ORBIT-TORQUE MAGNETIZATION ROTATIONAL ELEMENT AND SPIN-ORBIT-TORQUE MAGNETORESISTANCE EFFECT ELEMENT

(71) Applicant: TDK CORPORATION, Tokyo (JP)

(72) Inventors: Tomoyuki Sasaki, Tokyo (JP); Yohei Shiokawa, Tokyo (JP); Minoru Sanuki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 38 days.

(21) Appl. No.: 16/807,704

(22) Filed: Mar. 3, 2020

(65) Prior Publication Data
US 2020/0335691 A1 Oct. 22, 2020

Related U.S. Application Data

(63) Continuation-in-part of application No. 16/288,317, filed on Feb. 28, 2019, now abandoned.

(30) Foreign Application Priority Data

Sep. 7, 2018 (JP) .............................. JP2018-167892

(51) Int. Cl.
*H01L 29/82* (2006.01)
*H01L 43/02* (2006.01)
*H01F 10/32* (2006.01)

(52) U.S. Cl.
CPC .......... *H01L 43/02* (2013.01); *H01F 10/329* (2013.01); *H01F 10/3268* (2013.01); *H01F 10/3281* (2013.01)

(58) Field of Classification Search
CPC ... H01L 43/02; H01L 29/66984; H01L 43/04; H01L 43/06–065; H01L 43/14;
(Continued)

(56) References Cited

U.S. PATENT DOCUMENTS

| 8,350,347 B2 | 1/2013 | Gaudin et al. |
| 8,896,041 B2 | 11/2014 | De Brosse et al. |

(Continued)

FOREIGN PATENT DOCUMENTS

| JP | 2017-063397 A | 3/2017 |
| JP | 2017-216286 A | 12/2017 |
| WO | 2016021468 A1 | 2/2016 |

OTHER PUBLICATIONS

Y.K. Kato et al. "Observation of the Spin Hall Effect in Semiconductors". Science Magazine, vol. 306, Dec. 10, 2004, pp. 1910-1913.
(Continued)

*Primary Examiner* — Calvin Y Choi
(74) *Attorney, Agent, or Firm* — Oliff PLC

(57) ABSTRACT

A spin-orbit-torque magnetization rotational element and a spin-orbit-torque magnetoresistance effect element capable of easily rotating or reversing magnetization of a ferromagnetic layer. The spin-orbit-torque magnetization rotational element includes spin-orbit-torque wiring and a first ferromagnetic layer laminated on the spin-orbit-torque wiring in a first direction, wherein the spin-orbit-torque wiring includes a first region extending in a second direction, a second region extending in a third direction different from the second direction, and an intersection region where the first region and the second region intersect, and wherein the first ferromagnetic layer and the intersection region at least partially overlap in a plan view from the first direction.

21 Claims, 6 Drawing Sheets

(58) Field of Classification Search
CPC ... H01L 43/08; H01F 10/329; H01F 10/3269; H01F 10/3281; H01F 10/32–3295; G01R 15/202; G01R 33/07–077; G01R 33/09–098; G01R 15/205; H03B 15/00–006; G11B 5/39–3993; G11B 2005/3996; G11B 5/3909; G02F 2203/16; G11C 11/16–1697; Y10S 977/933–935
USPC ............................................................ 257/421
See application file for complete search history.

(56) References Cited

U.S. PATENT DOCUMENTS

| | | |
|---|---|---|
| 2015/0348606 A1 | 12/2015 | Buhrman et al. |
| 2016/0277000 A1 | 9/2016 | Shibata et al. |
| 2017/0222135 A1 | 8/2017 | Fukami et al. |
| 2018/0375015 A1* | 12/2018 | Sasaki .................. H01L 43/10 |

OTHER PUBLICATIONS

Ioan Mihai Miron et al. "Perpendicular Switching of a Single Ferromagnetic Layer Induced by In-Plane Current Injection". Nature, vol. 476, Aug. 11, 2011, pp. 189-194.

Luqiao Liu et al. "Spin Torque Switching With the Giant Spin Hall Effect of Tantalum". Science Magazine, vol. 336, Mar. 13, 2012, pp. 555.

Luqiao Liu et al. "Current-Induced Switching of Perpendicularly Magnetized Magnetic Layers Using Spin Torque From the Spin Hall Effect". Physical Review Letters, vol. 109, Aug. 31, 2012, pp. 096602-1 through 096602-5.

Ki-Seung Lee et al. "Threshold Current for Switching of a Perpendicular Magnetic Layer Induced by Spin Hall Effect". Applied Physics Letters, vol. 102, 2013, pp. 112410.

Ki-Seung Lee et al. "Thermally Activated Switching of Perpendicular Magnet by Spin-Orbit Spin Torque". Applied Physics Letters, vol. 104, 2014, pp. 072413-1 through 072413-5.

Shunsuke Fukami et al. "Magnetization Switching by Spin-Orbit Torque in an Antiferromagnet-Ferromagnet Bilayer System". Nature Materials, vol. 15, May 2016, pp. 535-542.

S. Takahashi et al. "Spin Injection and Detection in Magnetic Nanostructures". Physical Review B, vol. 67, 2003, pp. 052409-1 through 052409-4.

Yeongkyo Seo et al. "Area-Efficient SOT-MRAM With a Schottky Diode". IEEE Electron Device Letters, vol. 37, No. 8, Aug. 2016, pp. 982-985.

Wei Zhang et al. "Spin Hall Effects in Metallic Antiferromagnets". Physical Review Letters, vol. 113, Nov. 7, 2014, pp. 196602-1 through 196602-6.

H. Sato et al. "Perpendicular-Anisotropy CoFeB—MgO Magnetic Tunnel Junctions With a MgO/CoFeB/Ta/CoFeB/MgO Recording Structure". Applied Physics Letters, vol. 101, 2012, pp. 022414-1 through 022414-4.

Luqiao Liu et al. "Magnetic Oscillations Driven by the Spin Hall Effect in 3-Terminal Magnetic Tunnel Junction Devices". Physical Review Letters, vol. 109, Nov. 2, 2012, pp. 186602-1 through 186602-5.

Takashi Kimura et al. "Electrical Control of the Direction of Spin Accumulation". Physical Review Letters, vol. 99, 2007, pp. 166601-1 through 166601-4.

S. Fukami et al. "A Spin-Orbit Torque Switching Scheme With Collinear Magnetic Easy Axis and Current Configuration". Nature Nanotechnology, vol. 11, 2016, pp. 621.

Guoqiang Yu et al. "Switching of Perpendicular Magnetization by Spin-Orbit Torques in the Absence of External Magnetic Fields". Nature Nanotechnology, vol. 9, Jul. 2014, pp. 548-554.

* cited by examiner

SPIN-ORBIT-TORQUE MAGNETIZATION ROTATIONAL ELEMENT AND SPIN-ORBIT-TORQUE MAGNETORESISTANCE EFFECT ELEMENT

The present application is a continuation-in-part application based on U.S. patent application Ser. No. 16/288,317, filed Feb. 28, 2019 and claims priority to the continuation-in-part application and Japanese Patent Application No. 2018-167892, filed Sep. 7, 2018, the content of which is incorporated herein by reference.

BACKGROUND OF THE INVENTION

Field of the Invention

The present disclosure relates to a spin-orbit-torque magnetization rotational element and a spin-orbit-torque magnetoresistance effect element.

Description of Related Art

Expectation for applications of spintronics using a ferromagnetic spin to various elements is increasing. Examples of applications include a magnetic sensor, a high-frequency component, a magnetic head, and a nonvolatile random access memory (a magnetic random access memory (MRAM)).

An MRAM reads and writes data by using a characteristic that element resistance of a giant magnetoresistance (GMR) element or a tunneling magnetoresistance (TMR) element changes when a direction of mutual magnetization of two ferromagnetic layers for sandwiching an insulating layer changes. A high-frequency component oscillates using ferromagnetic resonance of magnetization of a ferromagnetic layer (for example, Patent Document 1). The ferromagnetic resonance occurs when the precession of the magnetization of the ferromagnetic layer coincides with a period of the applied high frequency.

Both the MRAM and the high-frequency component operate by controlling the magnetization of the ferromagnetic layer. In recent years, attention has been paid to a scheme using spin-orbit torque (SOT) as one scheme for controlling the rotation or reversal of the magnetization of the ferromagnetic layer (for example, Patent Document 2). The SOT is induced by a pure spin current or a Rashba effect at an interface of heterogeneous materials produced by spin-orbit interaction.

On the other hand, in the case of a magnetization reversal using SOT, according to a configuration of an element, it may be necessary to assist a magnetization reversal using an external magnetic field (for example, Non-Patent Document 1). In order to apply an external magnetic field, a source of the external magnetic field is necessary.

PATENT DOCUMENTS

[Patent Document 1] Japanese Unexamined Patent Application, First Publication No. 2017-063397
[Patent Document 2] Japanese Unexamined Patent Application, First Publication No. 2017-216286
[Patent Document 3] U.S. Pat. No. 8,896,041

NON-PATENT DOCUMENTS

[Non-Patent Document 1] S. Fukami, T. Anekawa, C. Zhang, and H. Ohno, Nature Nanotechnology, DOI: 10.1038/NNANO. 2016. 29.

In the MRAM, high speed is required. An SOT-MRAM has a lower degree of integration than a spin-transfer torque (STT)-MRAM, but is anticipated as a memory having high speed and high durability. A decrease in a writing current is an important issue because the writing current is large in the conventional MRAM and a reading speed is an issue in the SOT-MRAM. This is because the writing current becomes smaller and the speed becomes faster in the SOT-MRAM than in the STT-MRAM, and thus accuracy of the reading speed is required. In the SOT-MRAM, a reading current that has the same level as the writing current is applied for high-speed reading and it is necessary to curb a read-disturb problem that causes writing by the reading current. As shown in Patent Document 3, spin-orbit-torque wiring is installed under a magnetoresistance effect element, so that the magnetization reversal can easily occur due to an STT effect generated by applying an electric current to the magnetoresistance effect element and an SOT effect in the spin-orbit-torque wiring.

The present disclosure has been made in view of the above circumstances and provides a spin-orbit-torque magnetization rotational element and a spin-orbit-torque magnetoresistance effect element capable of curbing a read-disturb problem.

The present inventors have found that it is possible to easily curb a read-disturb problem by causing spin-orbit-torque wiring to be bent or branched and changing a spin-torque direction of an SOT effect generated at the time of writing and a spin-torque direction of an SOT effect generated at the time of reading.

That is, the present disclosure provides the following means to solve the above-described problems.

SUMMARY OF THE INVENTION (1) According to a first aspect, there is provided a spin-orbit-torque magnetization rotational element, including: spin-orbit-torque wiring; and a first ferromagnetic layer laminated on the spin-orbit-torque wiring in a first direction, wherein the spin-orbit-torque wiring includes a first region extending in a second direction; a second region extending in a third direction different from the second direction; and an intersection region where the first region and the second region intersect, and wherein the first ferromagnetic layer and the intersection region at least partially overlap in a plan view from the first direction.

(2) In the spin-orbit-torque magnetization rotational element according to the above-described aspect, a cross-sectional area of the first region may be wider than a cross-sectional area of the second region.

(3) In the spin-orbit-torque magnetization rotational element according to the above-described aspect, the spin-orbit-torque wiring may further include a third region extending from the intersection region in a fourth direction different from the second direction and the third direction.

(4) In the spin-orbit-torque magnetization rotational element according to the above-described aspect, a cross-sectional area of the first region may be wider than a cross-sectional area of the third region.

(5) In the spin-orbit-torque magnetization rotational element according to the above-described aspect, the second region and the third region may be asymmetric with respect to the second direction in which the first region extends.

(6) In the spin-orbit-torque magnetization rotational element according to the above-described aspect, at least a part of the first ferromagnetic layer may be projected from the intersection region in a plan view from the first direction.

(7) In the spin-orbit-torque magnetization rotational element according to the above-described aspect, a center-of-gravity position of the intersection region may be different from a center-of-gravity position of the first ferromagnetic layer in a plan view from the first direction and the center-of-gravity position of the intersection region may be positioned closer to the first region than the center-of-gravity position of the first ferromagnetic layer.

(8) According to a second aspect, there is provided a spin-orbit-torque magnetoresistance effect element, including: the spin-orbit-torque magnetization rotational element according to the above-described aspect; a nonmagnetic layer laminated on a surface opposite to the spin-orbit-torque wiring of the first ferromagnetic layer; and a second ferromagnetic layer configured to sandwich the nonmagnetic layer with the first ferromagnetic layer.

(9) According to a third aspect, there is provided a spin-orbit-torque magnetoresistance effect element including spin-orbit-torque wiring, a first ferromagnetic layer laminated on the spin-orbit-torque wiring in a first direction and having a variable magnetization direction, a second ferromagnetic layer having a substantially fixed magnetization direction, and a nonmagnetic layer between the first ferromagnetic layer and the second ferromagnetic layer, wherein the spin-orbit-torque wiring includes a first region extending in a second direction; and a second region extending in a third direction different from the second direction and wherein, in a plan view from the first direction, a writing current of the spin-orbit-torque magnetoresistance effect element is applied in the second direction of the spin-orbit-torque wiring and a reading current of the spin-orbit-torque magnetoresistance effect element is applied in the third direction of the spin-orbit-torque magnetoresistance effect element and the spin-orbit-torque wiring.

(10) In the spin-orbit-torque magnetoresistance effect element according to the above-described aspect, a direction of main magnetization of the first ferromagnetic layer may be orthogonal to the second direction.

(11) In the spin-orbit-torque magnetoresistance effect element according to the above-described aspect, lengths of the first ferromagnetic layer and the second ferromagnetic layer in the third direction may be longer than lengths of the first ferromagnetic layer and the second ferromagnetic layer in the second direction.

(12) In the spin-orbit-torque magnetoresistance effect element according to the above-described aspect, lengths of the first ferromagnetic layer and the second ferromagnetic layer in the second direction may be longer than lengths of the first ferromagnetic layer and the second ferromagnetic layer in the third direction.

It is possible to provide a spin-orbit-torque magnetization rotational element and a spin-orbit-torque magnetoresistance effect element capable of curbing a read-disturb problem.

DETAILED DESCRIPTION OF THE INVENTION

Figure 1:
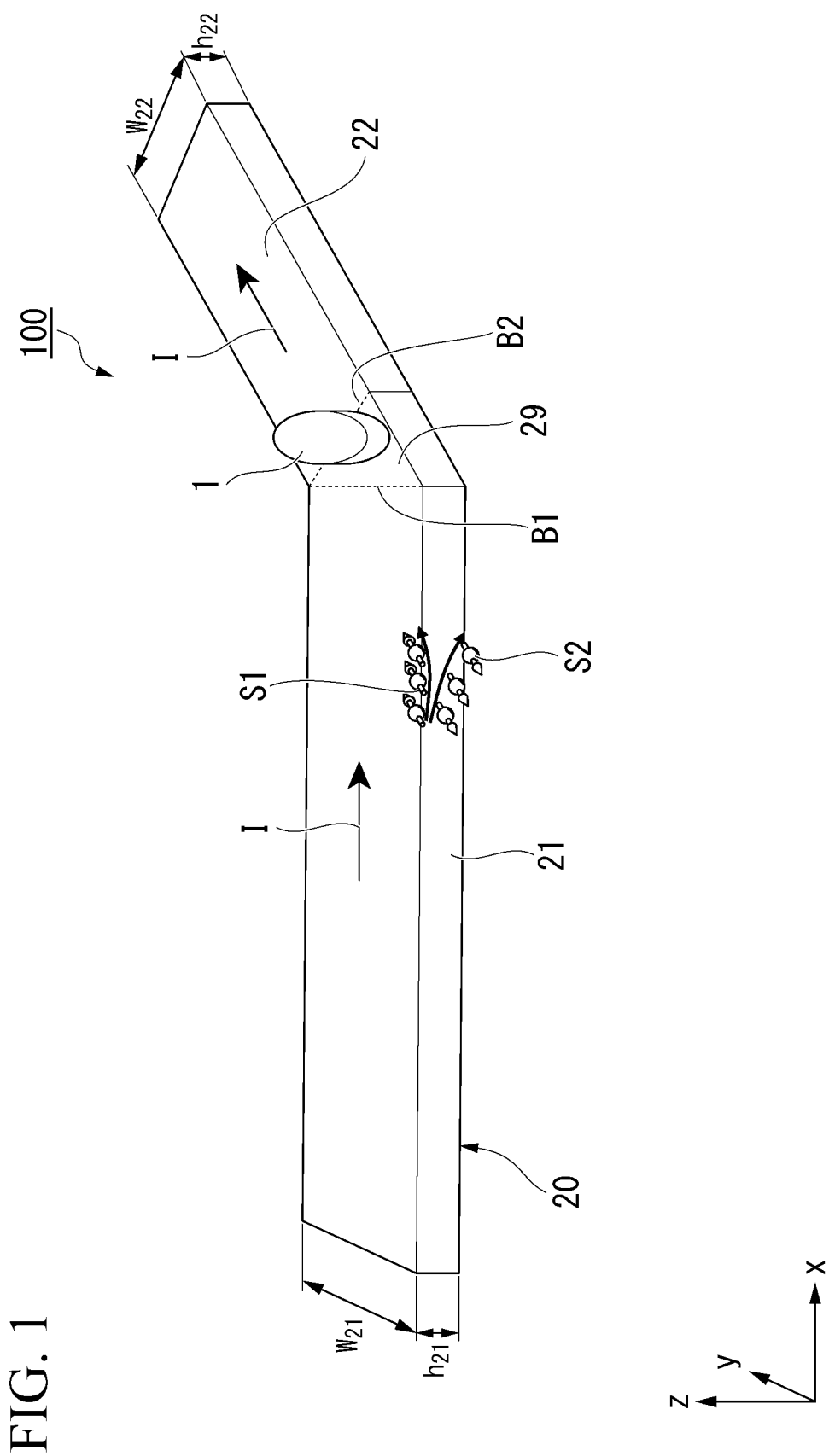
FIG. 1 is a perspective view of a spin-orbit-torque magnetization rotational element according to a first embodiment.

Hereinafter, embodiments will be described in detail with appropriate reference to the drawings. In the drawings used for the following description, there is a case where characteristic portions are shown by being enlarged for the sake of convenience in order to easily understand the characteristics, and a dimensional ratio or the like of each component is not limited to be the same as an actual value. The materials, dimensions and the like in the following description are merely an exemplary example, and the present disclosure is not limited thereto and can be carried out by being appropriately modified within a range where effects of the present disclosure are achieved.

First Embodiment (Spin-Orbit-Torque Magnetization Rotational Element)

Figure 2:
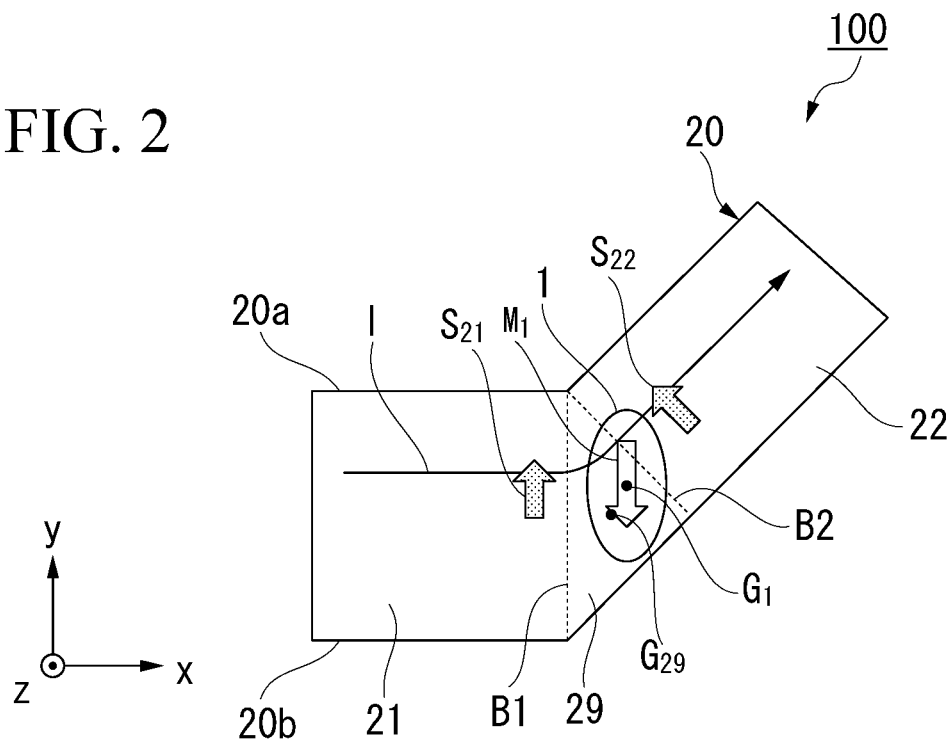
FIG. 2 is a plan view of the spin-orbit-torque magnetization rotational element according to the first embodiment.

FIG. 1 is a perspective view of a spin-orbit-torque magnetization rotational element 100 according to a first embodiment. FIG. 2 is a plan view of the spin-orbit-torque magnetization rotational element 100 according to the first embodiment. The spin-orbit-torque magnetization rotational element 100 shown in FIGS. 1 and 2 includes a first ferromagnetic layer 1 and spin-orbit-torque wiring 20.

First, directions are defined. The plane on which the spin-orbit-torque wiring 20 extends is defined as an xy plane and a direction in which the first ferromagnetic layer 1 is positioned with respect to the spin-orbit-torque wiring 20 is defined as a z-direction. Also, a direction in which a first region 21 of the spin-orbit-torque wiring 20 to be described below extends is defined as an x-direction. Also, a direction orthogonal to both the x-direction and the z-direction is defined as a y-direction.

<Spin-Orbit-Torque Wiring>

The spin-orbit-torque wiring 20 has the first region 21, a second region 22, and an intersection region 29. The spin-orbit-torque wiring 20 is bent in the intersection region 29. The first region 21 extends in the x-direction (a second direction). The second region 22 extends in a direction (a third direction) different from the x-direction in the xy plane. The intersection region 29 is a portion where the first region 21 and the second region 22 intersect.

The intersection region 29 is a region surrounded by interfaces between the regions (the first region 21 and the second region 22) and the intersection region 29 or by the interfaces between the regions (the first region 21 and the second region 22) and the intersection region 29 and a side surface of the spin-orbit-torque wiring 20.

An interface between the first region 21 and the intersection region 29 is defined as a first interface B1 and an interface between the second region 22 and the intersection region 29 is defined as a second interface B2. The intersection region 29 is a region surrounded by the first interface B1, the second interface B2, and the side surface of the spin-orbit-torque wiring 20. The first interface B1 and the second interface B2 are defined by the following procedure.

In the first region 21, two side surfaces (a first side surface 20a and a second side surface 20b (see FIG. 2)) of the spin-orbit-torque wiring 20 extend in the x-direction. When a tangent line along the first side surface 20a and the second side surface 20b of the spin-orbit-torque wiring 20 is drawn when viewed from the z-direction, the tangent line starts to incline from the x-direction. A point at which the tangent line starts to incline from the x-direction on the first side surface 20a is defined as a first point and a point at which the tangent line starts to incline from the x-direction at the second side surface 20b is defined as a second point. The first interface B1 is defined as an interface obtained by cutting the spin-orbit-torque wiring 20 along a straight line connecting the first point and the second point. Also, when a point starting to incline is defined, ignorable micro irregularities are ignorable.

Likewise, in the second region 22, the two side surfaces (the first side surface 20a and the second side surface 20b) of the spin-orbit-torque wiring 20 extend in the third direction. When the tangent line along the first side surface 20a and the second side surface 20b of the spin-orbit-torque wiring 20 is drawn when viewed from the z-direction, the tangent line starts to incline from the third direction. A point at which the tangent line starts to incline from the third direction on the first side surface 20a is defined as a third point and a point at which the tangent line starts to incline from the third direction on the second side surface 20b is defined as a fourth point. A second interface B2 is defined as an interface obtained by cutting the spin-orbit-torque wiring 20 along a straight line connecting the third point and the fourth point.

On the other hand, the first interface B1 and the second interface B2 obtained in the above-described procedure may coincide (for example, FIG. 2). That is, the first point and the third point may coincide, and the second point and the fourth point may coincide. Because the intersection region 29 is necessarily formed when the spin-orbit-torque wiring 20 is bent, the second interface B2 in this case follows the following rules.

When the first interface B1 and the second interface B2 coincide, the first point and the third point coincide. A perpendicular line is drawn from this first point (third point) towards the second side surface 20b. An intersection between the perpendicular line and the second side surface 20b becomes the fourth point. An interface formed by cutting a straight line connecting the third point and the fourth point in the z-direction becomes the second interface B2.

The spin-orbit-torque wiring 20 is wiring in which a spin current is generated by a spin Hall effect when a current I flows.

The spin Hall effect is a phenomenon in which the spin current is induced in a direction orthogonal to a direction of the current I on the basis of spin-orbit interaction when the current I flows through the wiring. A mechanism in which the spin current is generated by the spin Hall effect will be described.

When a potential difference is applied to both ends of the spin-orbit-torque wiring 20, the current I flows along the spin-orbit-torque wiring 20. When the current I flows, a first spin S1 oriented in one direction and a second spin S2 oriented in an opposite direction to the first spin S1 are bent in directions orthogonal to a current flow direction as shown in FIG. 1. For example, the first spin S1 is bent in a +z-direction with respect to a traveling direction, and the second spin S2 is bent in a −z-direction with respect to the traveling direction.

The normal Hall effect and the spin Hall effect are common in that (motion) moving charges (electrons) are bent in a motion (moving) direction. On the other hand, the normal Hall effect is significantly different from the spin Hall effect in that charged particles moving in a magnetic field undergo a Lorentz force so that they are bent in a motion direction in the normal Hall effect, whereas a moving direction of a spin is bent by the amount of movement of electrons (the amount of flow of a current) even when there is no magnetic field in the spin Hall effect.

In a nonmagnetic material (a material which is not ferromagnetic material), the number of electrons in the first spin S1 is equal to the number of electrons in the second spin S2. In FIG. 1, the number of electrons in the first spin S1 in the +z-direction is equal to the number of electrons in the second spin S2 in the −z-direction. Flows of charges in the z-direction for relaxing the localization of spins cancel each other and the amount of current becomes zero. In particular, a spin current that is not accompanied by a current is referred to as a pure spin current.

$J_S=J_\uparrow-J_\downarrow$ is defined when a flow of electrons in the first spin S1 is $J_\uparrow$, a flow of electrons in the second spin S2 is $J_\downarrow$, and a spin current is $J_S$. The spin current $J_S$ flows in the z-direction in FIG. 1. In FIG. 1, the first ferromagnetic layer 1 to be described below exists at a position in the z-direction of the spin-orbit-torque wiring 20. A spin is injected into the first ferromagnetic layer 1 according to the spin current.

As shown in FIGS. 1 and 2, the spin-orbit-torque wiring 20 has the first region 21 and the second region 22 extending in different directions. The first region 21 and the second region 22 are connected by the intersection region 29. The current I flowing through the spin-orbit-torque wiring 20 is bent in the intersection region 29.

In the first region 21 and the second region 22, an electron spin is bent by the spin Hall effect in a direction orthogonal to a flow direction of the current I in FIG. 2 and a spin current is generated (see the first spin S1 in FIG. 1). For example, in the example shown in FIG. 2, a spin $S_{21}$ oriented in a +y-direction in the first region 21 is supplied to the front side of a page surface and a spin $S_{22}$ oriented in a direction inclined from the +y-direction to a −x-direction in the second region 22 is supplied to the front side of the page surface. The spins $S_{21}$ and $S_{22}$ are injected into the first ferromagnetic layer 1 in the intersection region 29. The direction of the spin $S_{21}$ injected from the first region 21 into the first ferromagnetic layer 1 is different from a direction of the spin $S_{22}$ injected from the second region 22 into the first ferromagnetic layer 1.

It is preferable that a cross-sectional area of the first region 21 be larger than a cross-sectional area of the second region 22. It is possible to make a current density in the second region 22 higher than a current density in the first region 21. The spin-orbit-torque wiring 20 is normally formed as one film and a thickness $h_{21}$ of the first region 21 and a thickness $h_{22}$ of the second region 22 are normally equal. In this case, it is preferable that a width $w_{21}$ of the first region 21 be wider than the width $w_{22}$ of the second region 22. If the widths $w_{21}$ and $w_{22}$ change in the first region 21 and the second region 22, the widths of the first interface B1 and the second interface B2 are compared.

The spin-orbit-torque wiring 20 includes any one of a metal, an alloy, an intermetallic compound, a metal boride, a metal carbide, a metal silicide, and a metal phosphide having a function of generating a spin current using a spin Hall effect when an electric current flows.

It is preferable that a main configuration of the spin-orbit-torque wiring 20 be a nonmagnetic heavy metal. Here, the heavy metal means a metal having a specific gravity that is greater than or equal to that of yttrium. It is preferable that the nonmagnetic heavy metal be a nonmagnetic metal having an atomic number of 39 or more and having d or f electrons in an outermost shell. These nonmagnetic metals have large spin-orbit interaction that causes the spin Hall effect.

Electrons generally move in an opposite direction to a current regardless of a spin direction thereof. On the other hand, the nonmagnetic metals having a large atom number having d or f electrons in the outermost shell have large spin-orbit interaction and the spin Hall effect strongly acts. Thus, the direction of movement of electrons depends on a direction of a spin of electrons. Accordingly, in these nonmagnetic heavy metals, the spin current $J_S$ easily occurs.

Also, the spin-orbit-torque wiring 20 may include a magnetic metal. The magnetic metal is a ferromagnetic metal or an antiferromagnetic metal. If a small amount of magnetic metal is contained in the nonmagnetic metal, it becomes a scattering factor of a spin. If the spin is scattered, the spin-orbit interaction is enhanced and the spin current generation efficiency is increased with respect to a current. The main configuration of the spin-orbit-torque wiring 20 may be made of only an antiferromagnetic metal.

On the other hand, if an additional amount of magnetic metal is excessively increased, the generated spin current is scattered by the added magnetic metal, and the action of decreasing the spin current may become strong as a result. Thus, it is preferable that a molar ratio of the added magnetic metal be sufficiently smaller than a total molar ratio of elements constituting the spin-orbit-torque wiring. It is preferable that the molar ratio of the added magnetic metal be 3% or less of the total.

The spin-orbit-torque wiring 20 may include a topological insulator. The topological insulator is a material in which the inside of a substance is an insulator or a high-resistance membrane, but a spin-polarized metallic state is formed on the surface thereof. An internal magnetic field is generated in this material according to spin-orbit interaction. Therefore, even if there is no external magnetic field, a new topological phase is expressed due to an effect of the spin-orbit interaction. This is a topological insulator, and it is possible to generate a pure spin current with high efficiency by strong spin-orbit interaction and breaking of reversal symmetry at an edge.

As the topological insulator, for example, SnTe, $Bi_{1.5}Sb_{0.5}Te_{1.7}Se_{1.3}$, TlBiSe$_2$, Bi$_2$Te$_3$, Bi$_{1-x}$Sb$_x$, $(Bi_{1-x}Sb_x)_2Te_3$, and the like are preferable. These topological insulators can generate a spin current with high efficiency.

A direct current or an alternating current (a high-frequency current) flows through the spin-orbit-torque wiring 20. The direct current flows through the spin-orbit-torque wiring 20 when the spin-orbit-torque magnetization rotational element 100 is used for an MRAM or the like, and the alternating current (the high-frequency current) flows through the spin-orbit-torque wiring 20 when the spin-orbit-torque magnetization rotational element 100 is used for a high-frequency component and the like.

<First Ferromagnetic Layer>

The first ferromagnetic layer 1 is laminated in a first direction (the z-direction) with respect to the spin-orbit-torque wiring 20. The first ferromagnetic layer 1 functions by changing its magnetization direction. The first ferromagnetic layer 1 may be an in-plane magnetization film having an easy magnetization direction in the xy plane or a perpendicular magnetization film having an axis of easy magnetization in the z-direction. The shape of the first ferromagnetic layer 1 shown in FIG. 2 has a longitudinal axis in the y-direction. The magnetization $M_1$ of the first ferromagnetic layer 1 is oriented in the y-direction according to shape anisotropy.

A ferromagnetic material, particularly, a soft magnetic material, can be applied to the first ferromagnetic layer 1. For example, a metal selected from the group consisting of Cr, Mn, Co, Fe, and Ni, an alloy containing one or more of these metals, an alloy containing at least one element of these metals and B, C, and N, or the like can be used. Specifically, Co—Fe, Co—Fe—B, and Ni—Fe are exemplary examples. Also, when the first ferromagnetic layer 1 is an in-plane magnetized film, for example, it is preferable to use a Co—Ho alloy (CoHo$_2$), a Sm—Fe alloy (SmFe$_{12}$), or the like.

A material constituting the first ferromagnetic layer 1 may be a Heusler alloy. The Heusler alloy is a half-metal and has high spin polarizability. The Heusler alloy includes an intermetallic compound having a chemical composition of XYZ or X$_2$YZ, wherein X is a transition metal element or a noble metal element of a Co, Fe, Ni, or Cu group in the periodic table, Y is a transition metal of a Mn, V, Cr, or Ti group or an elemental species of X, and Z is a typical element of groups III and V. For example, Co$_2$FeSi, Co$_2$FeGe, Co$_2$FeGa, Co$_2$MnSi, Co$_2$Mn$_{1-a}$Fe$_a$Al$_b$Si$_{1-b}$, Co$_2$FeGe$_{1-c}$Ga$_c$, and the like can be cited.

The first ferromagnetic layer 1 overlaps at least a part of the intersection region 29 in a plan view from the z-direction. It is preferable that a part of the first ferromagnetic layer 1 be projected from the intersection region 29. Also, it is preferable that a center of gravity $G_{29}$ of the intersection region 29 be positioned closer to the first region 21 than a position of a center of gravity $G_1$ of the first ferromagnetic layer 1. Also, it is preferable that the center of gravity $G_1$ of the first ferromagnetic layer 1 be positioned in the third direction with respect to the center of gravity $G_{29}$ of the intersection region 29. The number of spins $S_{22}$ injected into the first ferromagnetic layer 1 increases, and the magnetization $M_1$ easily rotates.

It is preferable that a length of the first ferromagnetic layer 1 in a longitudinal axis direction in a plan view be 60 nm or less. A single magnetic domain of the first ferromagnetic layer 1 is formed. It is further preferable that the length of the first ferromagnetic layer 1 in the longitudinal axis direction in a plan view be 30 nm or less. Although the single magnetic domain is formed if the length of the first ferromagnetic layer 1 in the longitudinal axis direction is 60 nm or less, there is a possibility that a magnetic wall will transiently occur at the time of magnetization rotation. On the other hand, if the length of the first ferromagnetic layer 1 in the longitudinal axis direction is 30 nm or less, it operates as a single magnetic domain also during magnetization rotation. By forming the single magnetic domain of the first ferromagnetic layer 1, no magnetic domain is formed in the first ferromagnetic layer 1, and the spins $S_{21}$ and $S_{22}$ in different directions simultaneously act on the first ferromagnetic layer 1.

Next, an operation of the spin-orbit-torque magnetization rotational element 100 according to the first embodiment will be described. As shown in FIG. 2, when the current I flows through spin-orbit-torque wiring 20, a spin Hall effect occurs and a spin is injected into the first ferromagnetic layer 1.

The first ferromagnetic layer 1 is provided at a position at least partially overlapping the intersection region 29 in a plan view from the z-direction. The intersection region 29 is an intersection between the first region 21 and the second region 22. Therefore, the spin $S_{21}$ oriented in the y-direction is injected from the first region 21 into the first ferromagnetic layer 1 at a position overlapping the intersection region 29 and the spin $S_{22}$ oriented in a direction inclined from the y-direction to the x-direction is injected from the second region 22.

The spin $S_{21}$ applies torque of a direction for reversing the magnetization $M_1$ of the first ferromagnetic layer 1 to the magnetization $M_1$. The spin $S_{22}$ applies torque of a direction for rotating the magnetization $M_1$ of the first ferromagnetic layer 1 to the magnetization $M_1$. The spin $S_{22}$ assists the magnetization reversal using the spin $S_{21}$.

As described above, according to the spin-orbit-torque magnetization rotational element 100 according to the first embodiment, the magnetization of the ferromagnetic layer can be easily rotated or reversed.

Also, when a ratio of the spin $S_{22}$ injected into the first ferromagnetic layer 1 is increased, torque acts in a direction for rotating the magnetization $M_1$, and the magnetization $M_1$ performs precession. That is, the spin-orbit-torque magnetization rotational element 100 can be used as a high-frequency component (a high-frequency oscillator or a high-frequency filter) and a random number generator.

Here, although the case where the magnetization $M_1$ is oriented in the y-direction has been described as an example, an orientation direction of the magnetization $M_1$ is not limited. For example, when the magnetization $M_1$ is oriented in the x- or z-direction in magnetization reversal using SOT, an external magnetic field is required (Non-Patent Document 1). An external magnetic field is required because it disturbs the symmetry of a force applied to the magnetization $M_1$ and gives a trigger for a reversal or rotation of the magnetization $M_1$.

In the spin-orbit-torque magnetization rotational element 100 according to the first embodiment, the spins $S_{21}$ and $S_{22}$ oriented in different directions are injected into the first ferromagnetic layer 1, and the symmetry is disturbed. Therefore, in the spin-orbit-torque magnetization rotational element 100 according to the first embodiment, a magnetization reversal is also possible in an environment where no external magnetic field is applied (in a nonmagnetic field).

The spin-orbit-torque magnetization rotational element 100 according to the present embodiment can be applied to a spin-orbit-torque magnetoresistance effect element to be described below. However, the application of use is not limited to the magnetoresistance effect element, and the present disclosure can be applied to other applications of use. As other applications of use, for example, it is possible to arrange the spin-orbit-torque magnetization rotational element 100 in each pixel and use the spin-orbit-torque magnetization rotational element 100 in a spatial light modulator that spatially modulates incident light by using a magneto-optical effect. Also, the spin-orbit-torque magnetization rotational element 100 can be used as a high-frequency source by vibrating the magnetization $M_1$. When the magnetization is reversed, a spin-current magnetization rotational element is referred to as a spin-current magnetization reversal element in particular.

Second Embodiment

Figure 3:
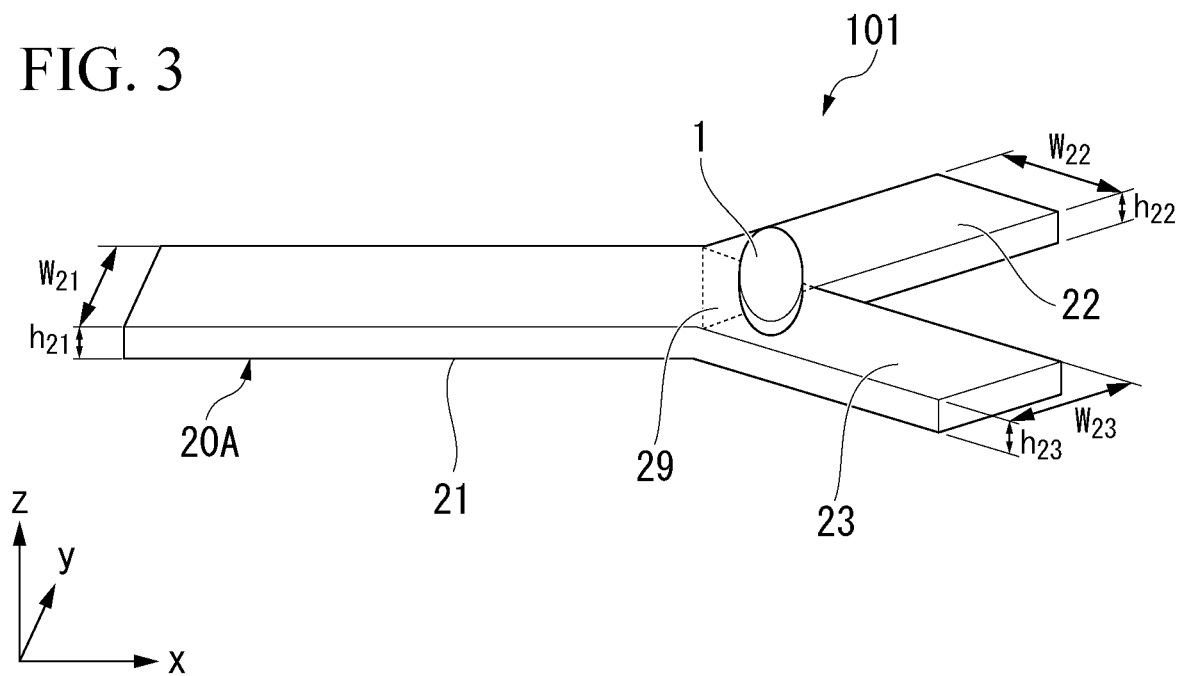
FIG. 3 is a perspective view of a spin-orbit-torque magnetization rotational element according to a second embodiment.
Figure 4:
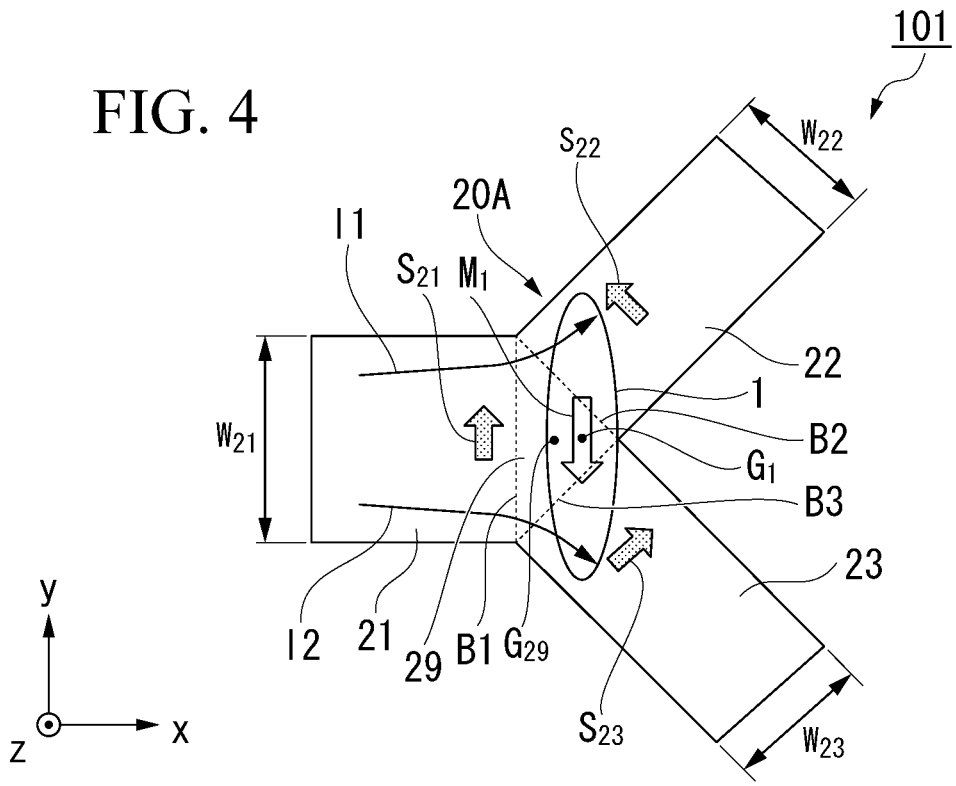
FIG. 4 is a plan view of the spin-orbit-torque magnetization rotational element according to the second embodiment.

FIG. 3 is a perspective view of a spin-orbit-torque magnetization rotational element 101 according to a second embodiment. FIG. 4 is a plan view of the spin-orbit-torque magnetization rotational element 101 according to the second embodiment. The spin-orbit-torque magnetization rotational element 101 shown in FIGS. 3 and 4 includes a first ferromagnetic layer 1 and spin-orbit-torque wiring 20A. In the spin-orbit-torque magnetization rotational element 101 according to the second embodiment, the configuration of the spin-orbit-torque wiring 20A is different from that of the spin-orbit-torque magnetization rotational element 100 according to the first embodiment.

The spin-orbit-torque wiring 20A has a first region 21, a second region 22, a third region 23, and an intersection region 29. The spin-orbit-torque wiring 20A branches at the intersection region 29. A current I1 and a current I2 branch or join at the intersection region 29. The first region 21 extends in an x-direction (a second direction). The second region 22 extends in a direction (a third direction) different from the x-direction in an xy plane. The third region 23 extends in a direction (a fourth direction) different from the x-direction (the second direction) and the third direction in the xy plane.

The intersection region 29 is a portion where the first region 21, the second region 22, and the third region 23 intersect. The intersection region 29 is a region surrounded by a first interface B1, a second interface B2, and a third interface B3. The first interface B1 and the second interface B2 are defined in a procedure similar to that of the first embodiment. The third interface B3 is defined similarly to the first interface B1 and the second interface B2. Points at which a tangent line along two side surfaces of the spin-orbit-torque wiring 20A in the third region 23 start to incline from the fourth direction are a fifth point and a sixth point. The third interface B3 is defined as an interface obtained by cutting the spin-orbit-torque wiring 20A along a straight line connecting together the fifth point and the sixth point.

The first ferromagnetic layer 1 is provided at a position at least partially overlapping the intersection region 29 in a plan view from the z-direction.

The spin generated in the first region 21, the second region 22, and the third region 23 by a spin Hall effect is oriented in a direction orthogonal to a current flow direction. That is, a direction of a spin $S_{21}$ injected from the first region 21 into the first ferromagnetic layer 1, a direction of a spin $S_{22}$ injected from the second region 22 into the first ferromagnetic layer 1, and a direction of a spin $S_{23}$ injected from the third region 23 into the first ferromagnetic layer 1 are different from one another.

As shown in FIGS. 3 and 4, it is preferable that a cross-sectional area of the first region 21 be larger than cross-sectional areas of the second region 22 and the third region 23. The spin-orbit-torque wiring 20A is normally formed as one film, and a thickness $h_{21}$ of the first region 21, a thickness $h_{22}$ of the second region 22, and a thickness $h_{23}$ of the third region 23 are normally equal. In this case, it is preferable that a width $w_{21}$ of the first region 21 be wider a width $w_{22}$ of the second region 22 and a width $w_{23}$ of the third region 23. When the widths $w_{21}$, $w_{22}$, and $w_{23}$ change in the first region 21, the second region 22, and the third region 23, the widths in the first interface B1, the second interface B2, and the third interface B3 are compared.

It is preferable that current densities of currents I1 and I2 in the second region 22 and the third region 23 be higher than current densities of currents I1 and I2 in the first region 21. When the current densities in the second region 22 and the third region 23 become higher than the current density in the first region 21, a ratio of the spins $S_{22}$ and $S_{23}$ among the spins $S_{21}$, $S_{22}$, and $S_{23}$ injected into the first ferromagnetic layer 1 is increased. The spins $S_{22}$ and $S_{23}$ act in a direction for rotating the magnetization $M_1$ of the first ferromagnetic layer 1. When the magnetization $M_1$ of the first ferromagnetic layer 1 performs precession, the spin-orbit-torque magnetization rotational element 101 functions as a high-frequency component (a high-frequency oscillator or a high-frequency filter).

Also, it is preferable that a part of the first ferromagnetic layer 1 be projected from the intersection region 29. Also, it is preferable that a position of a center of gravity $G_{29}$ of the intersection region 29 be positioned closer to the first region 21 than a position of a center of gravity $G_1$ of the first ferromagnetic layer 1. Also, it is preferable that the center of gravity $G_1$ of the first ferromagnetic layer 1 be positioned in a combined vector direction between the third direction and the fourth direction with respect to the center of gravity $G_{29}$ of the intersection region 29. The ratio of the spins $S_{22}$ and $S_{23}$ among the spins $S_{21}$, $S_{22}$, and $S_{23}$ injected into the first ferromagnetic layer 1 is increased. The magnetization $M_1$ of the first ferromagnetic layer 1 easily performs precession, and the spin-orbit-torque magnetization rotational element 101 can be used as a high-frequency component (a high-frequency oscillator or a high-frequency filter).

Also, when the spin-orbit-torque magnetization rotational element 101 is used as a high-frequency component, it is preferable that the shape of the first ferromagnetic layer 1 have a longitudinal axis in the y-direction orthogonal to the x-direction (the second direction). The magnetization $M_1$ of the first ferromagnetic layer 1 is easily oriented in the longitudinal axis direction under an influence of shape anisotropy of the first ferromagnetic layer 1. When the magnetization $M_1$ is oriented in the y-direction, the spins $S_{22}$ and $S_{23}$ easily act on the magnetization $M_1$.

It is preferable that the width of the longitudinal axis of the first ferromagnetic layer 1 be larger than at least one of the width $w_{21}$ of the first region 21, the width $w_{22}$ of the second region 22, and the width $w_{23}$ of the third region 23. The first ferromagnetic layer 1 straddles a plurality of regions and spins of different directions are easily injected into the first ferromagnetic layer 1.

Although the preferred embodiments of the present disclosure have been described in detail above, the present disclosure is not limited to the specific embodiments and various changes and modifications may be made without departing from the scope of the present disclosure described in the claims.

Figure 5:
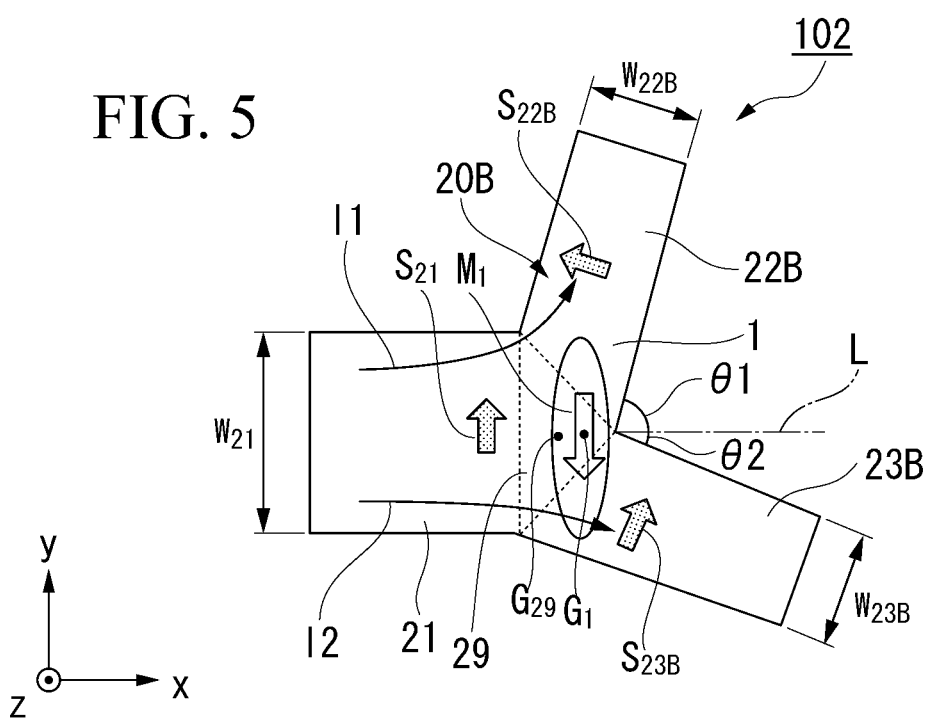
FIG. 5 is a plan view of another example of the spin-orbit-torque magnetization rotational element according to the second embodiment.

FIG. 5 is a plan view of another example of the spin-orbit-torque magnetization rotational element according to the second embodiment. The spin-orbit-torque magnetization rotational element 102 shown in FIG. 5 is different from the spin-orbit-torque magnetization rotational element 101 shown in FIG. 4 in that the second region 22B and the third region 23B are asymmetric with respect to the x-direction in which the first region 21 extends. Other configurations are similar to those of the spin-orbit-torque magnetization rotational element 101 shown in FIG. 4, and a description thereof will be omitted.

The term "asymmetric with respect to the x-direction in which the first region 21 extends" means that an angle $\theta 1$ formed by a reference line L extending in the x-direction and the second region 22 and an angle $\theta 2$ formed by the reference line L extending in the x-direction and the third region 23 are different from each other. If the second region 22 and the third region 23 are asymmetric with respect to the first region 21, the symmetry of the spins $S_{21}$, $S_{22B}$, and $S_{23B}$ injected into the first ferromagnetic layer 1 is more disturbed. If the symmetry of the force applied to the magnetization $M_1$ is disturbed, the reversal or rotation of the magnetization $M_1$ becomes easier.

Figure 6:
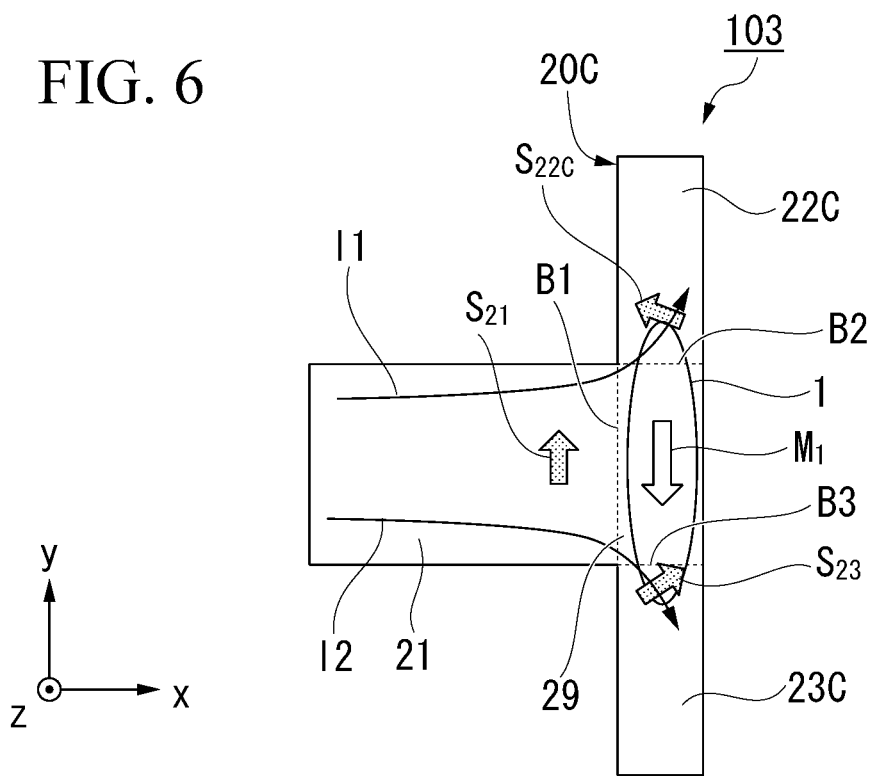
FIG. 6 is a plan view of another example of the spin-orbit-torque magnetization rotational element according to the second embodiment.

Also, FIG. 6 is a plan view of another example of the spin-orbit-torque magnetization rotational element according to the second embodiment. In a spin-orbit-torque magnetization rotational element 103 shown in FIG. 6, a configuration of a spin-orbit-torque wiring 20C is different from that of the spin-orbit-torque magnetization rotational element 101 shown in FIG. 4. Specifically, the spin-orbit-torque magnetization rotational element 103 shown in FIG. 6 is different from the spin-orbit-torque magnetization rotational element 101 shown in FIG. 4 in that a second region 22C and a third region 23C extend in a direction orthogonal to the x-direction in which the first region 21 extends. Other configurations are similar to those of the spin-orbit-torque magnetization rotational element 101 shown in FIG. 4, and a description thereof will be omitted.

As shown in FIG. 6, when the first region 21, the second region 22C, and the third region 23C are orthogonal to one another, one side surface of the spin-orbit-torque wiring 20C extends in one direction and a tangent line along the side surface does not incline from a third direction or a fourth direction in the second region 22C and the third region 23C. In this case, a perpendicular line is drawn from a first point and a second point thereof toward an opposite side surface. Intersection points between the perpendicular line and the side surface are a fourth point and a sixth point. An interface formed by cutting a straight line connecting a third point and the fourth point in the z-direction becomes a second interface B2 and an interface formed by cutting a straight line connecting a fifth point and the sixth point in the z-direction is a third interface B3.

Even when the first region 21, the second region 22C, and the third region 23C are perpendicular, spins $S_{21}$, $S_{22C}$, and $S_{23C}$ having different directions can be injected into a first ferromagnetic layer 1. Therefore, the symmetry of a force applied to the magnetization $M_1$ is disturbed and the magnetization $M_1$ can easily be reversed or rotated. The spins $S_{22C}$ and $S_{23C}$ act in a direction for rotating the magnetization $M_1$ of the first ferromagnetic layer 1. By performing the precession of the magnetization $M_1$ of the first ferromagnetic layer 1, the spin-orbit-torque magnetization rotational element 103 functions as a high-frequency component (a high-frequency oscillator or a high-frequency filter).

Figure 7:
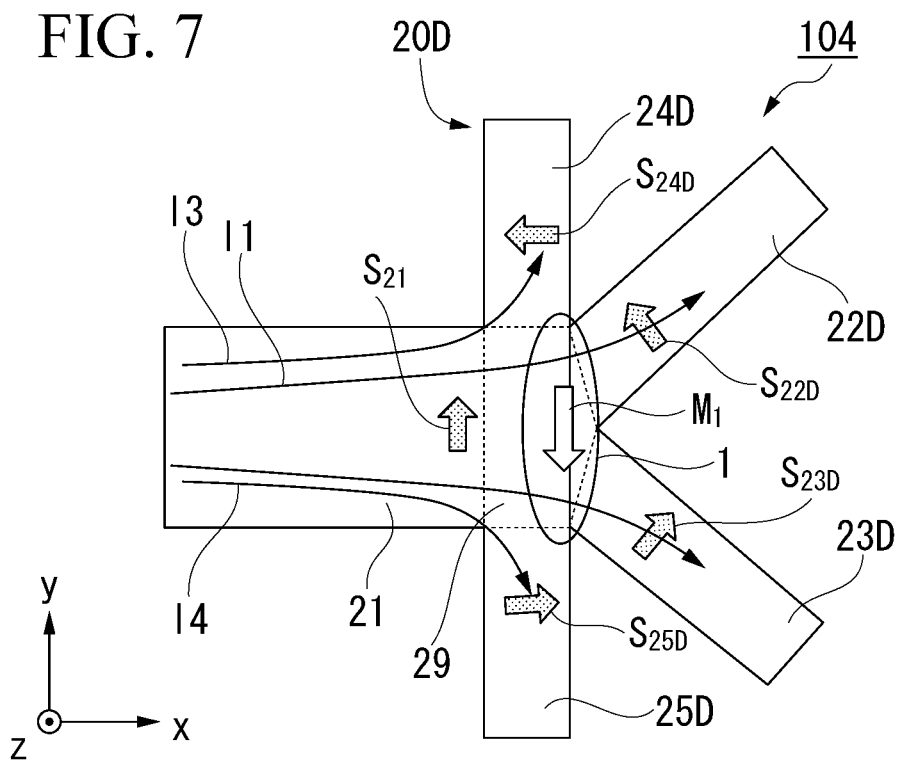
FIG. 7 is a plan view of another example of the spin-orbit-torque magnetization rotational element according to the second embodiment.
Figure 8:
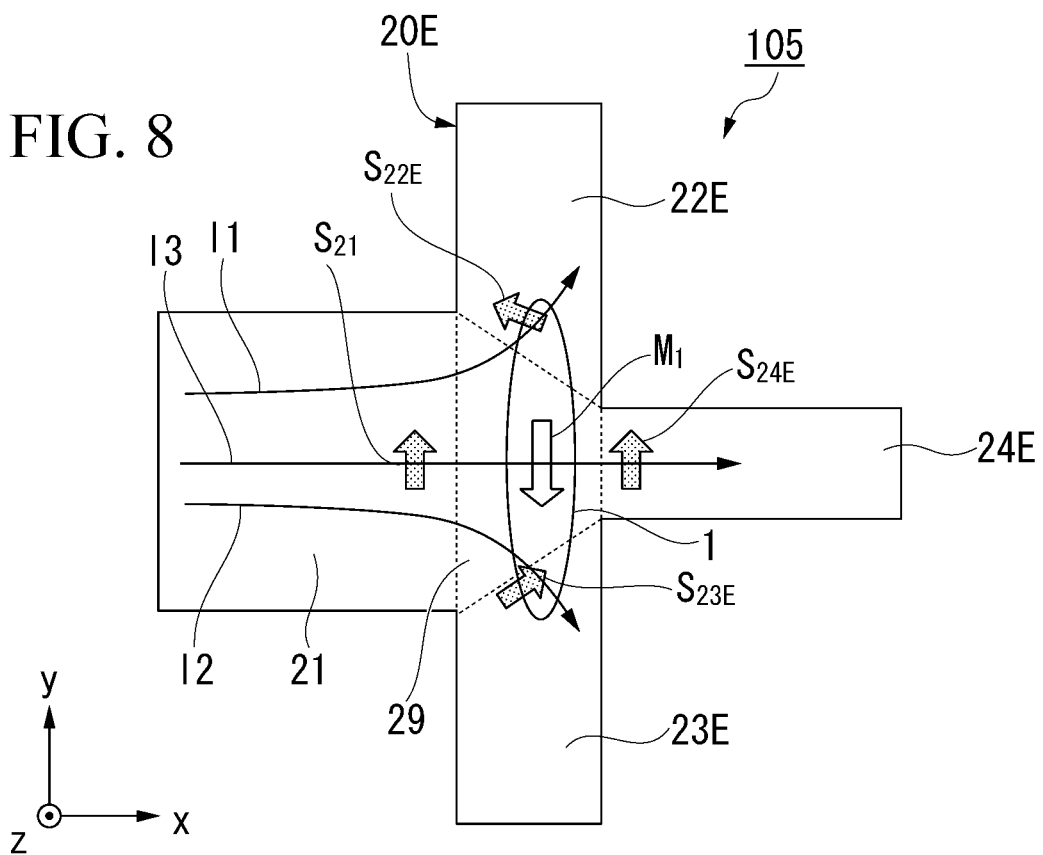
FIG. 8 is a plan view of another example of the spin-orbit-torque magnetization rotational element according to the second embodiment.

Although the case where the spin-orbit-torque wiring 20 branches from the first region 21 toward the second region 22 and the third region 23 has been described above as an example, the spin-orbit-torque wiring 20 may branch into three or more regions. FIGS. 7 and 8 are plan views of other examples of the spin-orbit-torque magnetization rotational element according to the second embodiment. Spin-orbit-torque magnetization rotational elements 104 and 105 shown in FIGS. 7 and 8 are examples in which spin-orbit-torque wirings 20D and 20F branch into three or more regions.

In the spin-orbit-torque magnetization rotational element 104 shown in FIG. 7, the spin-orbit-torque wiring 20D branches into four regions from a first region 21. The spin-orbit-torque wiring 20D has the first region 21, a second region 22D, a third region 23D, a fourth region 24D, a fifth region 25D and an intersection region 29. Interfaces between the intersection region 29 and the regions are required to follow the above-described rules. Four current paths are formed in the spin-orbit-torque wiring 20D and currents I1, I2, I3, and I4 flow. In the first ferromagnetic layer 1, spins $S_{21}$, $S_{22D}$, $S_{23D}$, $S_{24D}$, $S_{25D}$ oriented in different directions are injected.

In a spin-orbit-torque magnetization rotational element 105 shown in FIG. 8, the spin-orbit-torque wiring 20F branches into three regions from the first region 21. The spin-orbit-torque wiring 20F has a first region 21, a second region 22F, a third region 23F, and an intersection region 29. Three current paths are formed in the spin-orbit-torque wiring 20F and currents I1, I2, and I3 flow. Spins $S_{21}$, $S_{22F}$, $S_{23F}$, and $S_{24F}$ oriented in different directions are injected into a first ferromagnetic layer 1.

In the examples shown in FIGS. 7 and 8, the symmetry of the force applied to the magnetization $M_1$ is disturbed, and the magnetization $M_1$ can be easily reversed or rotated. By increasing the number of spins supplied to the first ferromagnetic layer 1 acting in the direction for rotating the magnetization $M_1$ of the first ferromagnetic layer 1, the spin-orbit-torque magnetization rotational elements 104 and 105 can be suitably used as high-frequency components (high-frequency oscillators or high-frequency filters).

Third Embodiment (Spin-Orbit-Torque Magnetoresistance Effect Element)

Figure 9:
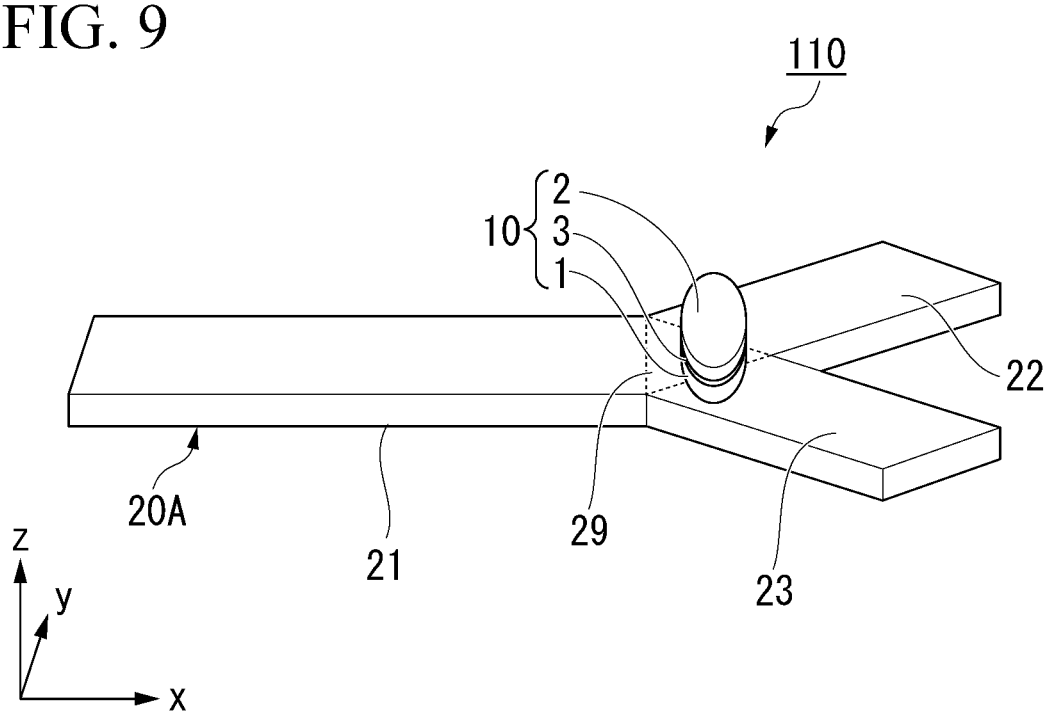
FIG. 9 is a perspective view of a spin-orbit-torque magnetoresistance effect element according to a third embodiment.

FIG. 9 is a schematic cross-sectional view of a spin-orbit-torque magnetoresistance effect element 110 according to the second embodiment. The spin-orbit-torque magnetoresistance effect element 110 shown in FIG. 9 has a functional portion 10 and spin-orbit-torque wiring 20A. The functional portion 10 includes a first ferromagnetic layer 1, a nonmagnetic layer 3, and a second ferromagnetic layer 2. The first ferromagnetic layer 1 and the spin-orbit-torque wiring 20A correspond to those of the spin-orbit-torque magnetization rotational element 101 according to the second embodiment shown in FIG. 3. The spin-orbit-torque magnetization rotational element 101 can be replaced with the other spin-orbit-torque magnetization rotational elements 100, 102, 103, 104, and 105 described above. Descriptions of configurations equivalent to that of the spin-orbit-torque magnetization rotational element 101 of the second embodiment will be omitted.

The functional portion 10 functions as in a normal magnetoresistance effect element. The functional portion 10 functions according to magnetization of the second ferromagnetic layer 2 fixed in one direction (z-direction) and a relative change in the magnetization direction of the first ferromagnetic layer 1. If the spin-orbit-torque magnetization rotational element 110 is applied to a coercive force difference type (pseudo spin valve type) MRAM, the coercive force of the second ferromagnetic layer 2 is made larger than the coercive force of the first ferromagnetic layer 1. If the spin-orbit-torque magnetization rotational element 110 is applied to an exchange bias type (spin valve type) MRAM, the magnetization of the second ferromagnetic layer 2 is fixed by exchange coupling with the antiferromagnetic layer.

Also, the functional portion 10 has a configuration similar to that of a tunnel magnetoresistance effect (tunneling magnetoresistance (TMR)) element if the nonmagnetic layer 3 is made of an insulator and has a configuration similar to that of a giant magnetoresistance effect (giant magnetoresistance (GMR)) element if the nonmagnetic layer 3 is made of a metal.

A lamination configuration of a well-known magnetoresistance effect element can be adopted as a lamination configuration of the functional portion 10. For example, each layer may include a plurality of layers or may include another layer such as an antiferromagnetic layer for fixing a magnetization direction of the second ferromagnetic layer 2. The second ferromagnetic layer 2 is referred to as a fixed layer or a reference layer, and the first ferromagnetic layer 1 is referred to as a free layer, a memory layer, or the like.

A material similar to that of the first ferromagnetic layer 1 can be used as the material of the second ferromagnetic layer 2.

To further increase a coercive force of the second ferromagnetic layer 2 with respect to the first ferromagnetic layer 1, an antiferromagnetic material such as IrMn or PtMn may be used as a material in contact with the second ferromagnetic layer 2. Furthermore, to prevent a leakage magnetic field of the second ferromagnetic layer 2 from affecting the first ferromagnetic layer 1, a synthetic ferromagnetic coupling structure may be adopted.

For the nonmagnetic layer 3, a well-known material can be used.

For example, when the nonmagnetic layer 3 is made of an insulator (in the case of a tunnel barrier layer), $Al_2O_3$, $SiO_2$, MgO, $MgAl_2O_4$, or the like can be used as a material thereof. In addition to these materials, a material in which some of Al, Si, and Mg are replaced with Zn, Be, or the like can also be used. Because MgO and $MgAl_2O_4$ among them are materials that can implement a coherent tunnel, a spin can be efficiently injected. When the nonmagnetic layer 3 is made of a metal, Cu, Au, Ag, or the like can be used as a material thereof. Further, if the nonmagnetic layer 3 is made of a semiconductor, Si, Ge, $CuInSe_2$, $CuGaSe_2$, Cu(In, Ga)$Se_2$, or the like can be used as a material thereof.

The functional portion 10 may have other layers. An underlayer may be provided on a surface of the first ferromagnetic layer 1 opposite to the nonmagnetic layer 3. It is preferable that a layer arranged between the spin-orbit-torque wiring 20A and the first ferromagnetic layer 1 not dissipate a spin propagating from the spin-orbit-torque wiring 20A. For example, it is known that silver, copper, magnesium, aluminum, or the like have a long spin diffusion length of 100 nm or more and a spin hardly dissipates. It is preferable that the thickness of this layer is less than or equal to a spin diffusion length of a material constituting the layer. If the thickness of the layer is less than or equal to the spin diffusion length, it is possible to sufficiently transfer the spin propagating from the spin-orbit-torque wiring 20A to the first ferromagnetic layer 1.

Also in the spin-orbit-torque magnetoresistance effect element 110 according to the third embodiment, the symmetry of the force applied to the magnetization $M_1$ can be disturbed, and the magnetization $M_1$ can be easily reversed or rotated. By causing the magnetization $M_1$ to perform precession, the spin-orbit-torque magnetoresistance effect element 110 can be suitably used as a high-frequency component (a high-frequency oscillator or a high-frequency filter).

Fourth Embodiment (Spin-Orbit-Torque Magnetoresistance Effect Element)

Figure 10:
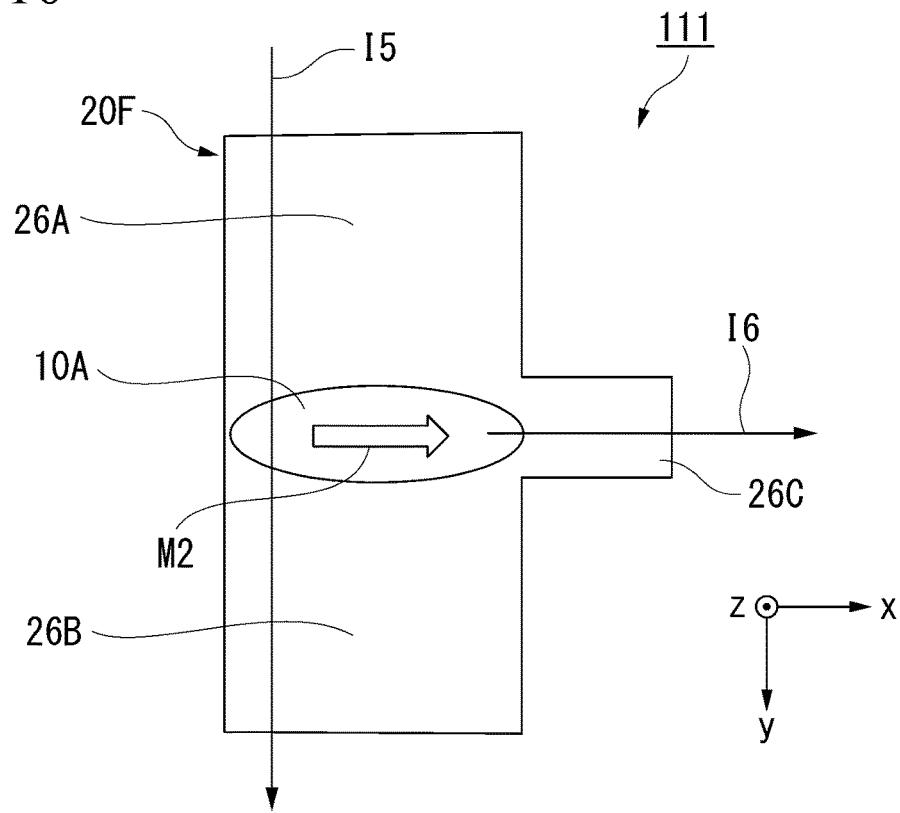
FIG. 10 is a plan view of a spin-orbit-torque magnetoresistance effect element according to a fourth embodiment.

FIG. 10 is a plan view of a spin-orbit-torque magnetoresistance effect element according to a fourth embodiment. A spin-orbit-torque magnetoresistance effect element 111 shown in FIG. 10 includes a functional portion 10A and spin-orbit-torque wiring 20F.

The spin-orbit-torque wiring 20F has a first region 26A and a second region 26B through which an electric current passes at the time of writing and a third region 26C through which an electric current passes at the time of reading. That is, in the plan view from a first direction (for example, a z-direction), a writing current I5 of the spin-orbit-torque magnetoresistance effect element 111 is applied in a second direction (for example, a y-direction) of the spin-orbit-torque wiring 20F and a reading current I6 of the spin-orbit-torque magnetoresistance effect element 111 is applied in a third direction (for example, an x-direction) of the spin-orbit-torque magnetoresistance effect element 111 and the spin-orbit-torque wiring 20F.

The functional portion 10A includes a first ferromagnetic layer 1, a nonmagnetic layer 3, and a second ferromagnetic layer 2 (see FIG. 9). A direction of main magnetization M2 of the first ferromagnetic layer 1 is orthogonal to the second direction. Also, lengths of the first ferromagnetic layer 1 and the second ferromagnetic layer 2 in the third direction are longer than lengths of the first ferromagnetic layer 1 and the second ferromagnetic layer 2 in the second direction. The first ferromagnetic layer 1 and the spin-orbit-torque wiring 20F correspond to the spin-orbit-torque magnetization rotational element 101 according to the second embodiment shown in FIG. 3. The spin-orbit-torque magnetization rotational element 101 can be replaced with the other spin-orbit-torque magnetization rotational elements 100, 102, 103, 104, and 105. Description of a configuration equivalent to that of the spin-orbit-torque magnetization rotational element 101 of the second embodiment will be omitted.

The writing current I5 passes through the first region 26A and the second region 26B of the spin-orbit-torque wiring 20F in the second direction. The reading current I6 passes through the spin-orbit-torque magnetization rotational element 101 in the first direction, moves to the spin-orbit-torque magnetization rotational element 101 and the spin-orbit-torque wiring 20F, and passes through the third region 26C to flow in the third direction. At this time, if the axis of easy magnetization of the spin-orbit-torque magnetization rotational element 101 is the main direction of the third direction, the spin direction of the spin current generated by the writing current I5 is the same as that of the spin-orbit-torque magnetization rotational element 101 and data is written in the spin-orbit-torque magnetization rotational element 101. Also, although the reading current I6 generates a spin current in the spin-orbit-torque wiring 20F, data is not rewritten in the spin-orbit-torque magnetization rotational element 101 because the current flows in the third direction and the spin direction of the spin current is orthogonal to the spin-orbit-torque magnetization rotational element 101. Therefore, the read-disturb problem can be curbed.

In FIG. 10, a writing current density in the functional portion 10A decreases at the time of writing, but the length of the third region 26C in the second direction is short. Thus, the writing current of the spin-orbit-torque magnetization rotational element 101 enables data to be written with a writing current density equivalent to that when the third region 26C is not provided.

Figure 11:
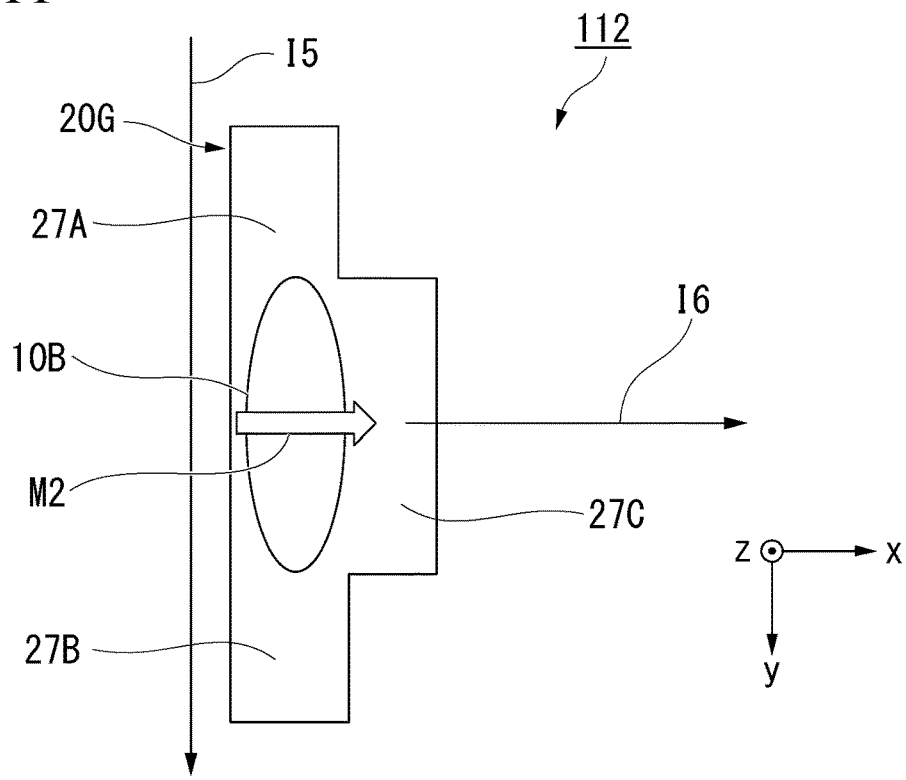
FIG. 11 is a plan view of a spin-orbit-torque magnetoresistance effect element according to a fifth embodiment

FIG. 11 is a plan view of a spin-orbit-torque magnetoresistance effect element according to a fifth embodiment.

A spin-orbit-torque magnetoresistance effect element 112 shown in FIG. 11 includes a functional portion 10B and spin-orbit-torque wiring 20G. The spin-orbit-torque wiring 20G has a first region 27A and a second region 27B through which an electric current passes at the time of writing and a third region 27C through which an electric current passes at the time of reading. Also, in the functional portion 10B, lengths of a first ferromagnetic layer 1 and a second ferromagnetic layer 2 in the above-described second direction are longer than lengths of the first ferromagnetic layer 1 and the second ferromagnetic layer 2 in the above-described third direction.

In FIG. 11, a writing current density in the functional portion 10B decreases at the time of writing, but a length of the third region 27C in the second direction is longer than that of the third region 26C of FIG. 10. Thus, a writing current of the spin-orbit-torque magnetization rotational element 101 enables data to be written with a higher writing current density than when the third region 27C is not provided. However, because the current density of the third region 27C at the time of reading is reduced, the read-disturb problem can be further curbed as compared with the configuration of FIG. 10.

EXPLANATION OF REFERENCES

1 First ferromagnetic layer
2 Second ferromagnetic layer
3 Nonmagnetic layer
10, 10A, 10B Functional portion
20, 20B, 20C, 20D, 20E, 20F, 20G Spin-orbit-torque wiring
21 First region
22, 22B, 22C, 22D, 22E Second region
23, 23B, 23C, 23D, 23E Third region
24D, 24E Fourth region
25D Fifth region
26A, 27A First region
26B, 27B Second region
26C, 27C Third region
29 Intersection region
100, 101, 102, 103, 104, 105 Spin-orbit-torque magnetization rotational element
110, 111, 112 Spin-orbit-torque magnetoresistance effect element
$G_1, G_{29}$ Center of gravity
$S_{21}, S_{22}, S_{23}, S_{22B}, S_{23B}, S_{22C}, S_{23C}, S_{22D}, S_{23D}, S_{24D}, S_{25D}, S_{22E}, S_{23E}, S_{24E}$ Spin
$M_1$, M2 Magnetization

What is claimed is:
1. A spin-orbit-torque magnetization rotational element, comprising:
   a first ferromagnetic layer; and
   spin-orbit-torque wiring, the first ferromagnetic layer being laminated on the spin-orbit-torque wiring in a first direction, the spin-orbit-torque wiring including:
      a first region extending in a second direction;
      a second region extending in a third direction different from the second direction;
      an intersection region where the first region and the second region intersect, the first ferromagnetic layer and the intersection region at least partially overlapping in a plan view from the first direction; and
      a third region extending from the intersection region in a fourth direction different from the second direction and the third direction,
   wherein the second region and the third region are asymmetric with respect to the second direction in which the first region extends.

2. The spin-orbit-torque magnetization rotational element according to claim 1, wherein a cross-sectional area of the first region is wider than a cross-sectional area of the second region.

3. The spin-orbit-torque magnetization rotational element according to claim 1, wherein a cross-sectional area of the first region is wider than a cross-sectional area of the third region.

4. The spin-orbit-torque magnetization rotational element according to claim 2, wherein the cross-sectional area of the first region is wider than a cross-sectional area of the third region.

5. The spin-orbit-torque magnetization rotational element according to claim 1, wherein at least a part of the first ferromagnetic layer is projected from the intersection region in the plan view from the first direction.

6. The spin-orbit-torque magnetization rotational element according to claim 2, wherein at least a part of the first ferromagnetic layer is projected from the intersection region in the plan view from the first direction.

7. The spin-orbit-torque magnetization rotational element according to claim 3, wherein at least a part of the first ferromagnetic layer is projected from the intersection region in the plan view from the first direction.

8. The spin-orbit-torque magnetization rotational element according to claim 4, wherein at least a part of the first ferromagnetic layer is projected from the intersection region in the plan view from the first direction.

9. A spin-orbit-torque magnetization rotational element, comprising:
a first ferromagnetic layer; and
spin-orbit-torque wiring, the first ferromagnetic layer being laminated on the spin-orbit-torque wiring in a first direction, the spin-orbit-torque wiring including:
a first region extending in a second direction;
a second region extending in a third direction different from the second direction; and
an intersection region where the first region and the second region intersect, the first ferromagnetic layer and the intersection region at least partially overlapping in a plan view from the first direction,
wherein a center-of-gravity position of the intersection region is different from a center-of-gravity position of the first ferromagnetic layer in the plan view from the first direction, and
the center-of-gravity position of the intersection region is positioned closer to the first region than the center-of-gravity position of the first ferromagnetic layer.

10. The spin-orbit-torque magnetization rotational element according to claim 2,
wherein a center-of-gravity position of the intersection region is different from a center-of-gravity position of the first ferromagnetic layer in the plan view from the first direction, and
the center-of-gravity position of the intersection region is positioned closer to the first region than the center-of-gravity position of the first ferromagnetic layer.

11. The spin-orbit-torque magnetization rotational element according to claim 1,
wherein a center-of-gravity position of the intersection region is different from a center-of-gravity position of the first ferromagnetic layer in the plan view from the first direction, and
the center-of-gravity position of the intersection region is positioned closer to the first region than the center-of-gravity position of the first ferromagnetic layer.

12. A spin-orbit-torque magnetoresistance effect element, comprising:
the spin-orbit-torque magnetization rotational element according to claim 1;
a nonmagnetic layer laminated on a surface opposite to the spin-orbit-torque wiring of the first ferromagnetic layer; and
a second ferromagnetic layer configured to sandwich the nonmagnetic layer with the first ferromagnetic layer.

13. A spin-orbit-torque magnetoresistance effect element comprising:
a first ferromagnetic layer having a variable magnetization direction;
a second ferromagnetic layer having a substantially fixed magnetization direction;
a nonmagnetic layer between the first ferromagnetic layer and the second ferromagnetic layer; and
spin-orbit-torque wiring, the first ferromagnetic layer being laminated on the spin-orbit-torque wiring in a first direction, the spin-orbit-torque wiring including:
a first region extending in a second direction; and
a second region extending in a third direction different from the second direction,
wherein the spin-orbit-torque magnetoresistance effect element is configured so that, in a plan view from the first direction, a writing current of the spin-orbit-torque magnetoresistance effect element is applied in the second direction of the spin-orbit-torque wiring and a reading current of the spin-orbit-torque magnetoresistance effect element is applied in the third direction of the spin-orbit-torque magnetoresistance effect element and the spin-orbit-torque wiring, and
lengths of the first ferromagnetic layer and the second ferromagnetic layer in the third direction are longer than lengths of the first ferromagnetic layer and the second ferromagnetic layer in the second direction.

14. The spin-orbit-torque magnetoresistance effect element according to claim 13, wherein a direction of main magnetization of the first ferromagnetic layer is orthogonal to the second direction.

15. A spin-orbit-torque magnetoresistance effect element comprising:
a first ferromagnetic layer having a variable magnetization direction;
a second ferromagnetic layer having a substantially fixed magnetization direction;
a nonmagnetic layer between the first ferromagnetic layer and the second ferromagnetic layer; and
spin-orbit-torque wiring, the first ferromagnetic layer being laminated on the spin-orbit-torque wiring in a first direction, the spin-orbit-torque wiring including:
a first region extending in a second direction; and
a second region extending in a third direction different from the second direction,
wherein the spin-orbit-torque magnetoresistance effect element is configured so that, in a plan view from the first direction, a writing current of the spin-orbit-torque magnetoresistance effect element is applied in the second direction of the spin-orbit-torque wiring and a reading current of the spin-orbit-torque magnetoresistance effect element is applied in the third direction of the spin-orbit-torque magnetoresistance effect element and the spin-orbit-torque wiring, and
lengths of the first ferromagnetic layer and the second ferromagnetic layer in the second direction are longer than lengths of the first ferromagnetic layer and the second ferromagnetic layer in the third direction.

16. The spin-orbit-torque magnetoresistance effect element according to claim 14, wherein lengths of the first ferromagnetic layer and the second ferromagnetic layer in the second direction are longer than lengths of the first ferromagnetic layer and the second ferromagnetic layer in the third direction.

17. The spin-orbit-torque magnetoresistance effect element according to claim 13, wherein lengths of the first ferromagnetic layer and the second ferromagnetic layer in the second direction are longer than lengths of the first ferromagnetic layer and the second ferromagnetic layer in the third direction.

18. The spin-orbit-torque magnetoresistance effect element according to claim 15, wherein a direction of main magnetization of the first ferromagnetic layer is orthogonal to the second direction.

19. The spin-orbit-torque magnetization rotational element according to claim 9, wherein a cross-sectional area of the first region is wider than a cross-sectional area of the second region.

20. The spin-orbit-torque magnetization rotational element according to claim 9, wherein the spin-orbit-torque wiring further includes a third region extending from the intersection region in a fourth direction different from the second direction and the third direction.

21. The spin-orbit-torque magnetization rotational element according to claim 20, wherein a cross-sectional area of the first region is wider than a cross-sectional area of the third region.

\* \* \* \* \*